(12) United States Patent
Peckham et al.

(10) Patent No.: US 6,700,451 B1
(45) Date of Patent: Mar. 2, 2004

(54) CROSS COUPLED CASCODE VOLTAGE CONTROLLED OSCILLATOR

(75) Inventors: David S. Peckham, Barrington Hills, IL (US); James S. Irwin, Paige, TX (US)

(73) Assignee: Motorola, Inc., Schaumburg, IL (US)

( * ) Notice: Subject to any disclaimer, the term of this patent is extended or adjusted under 35 U.S.C. 154(b) by 33 days.

(21) Appl. No.: 10/281,591

(22) Filed: Oct. 28, 2002

(51) Int. Cl.[7] ................................................. H03B 5/00
(52) U.S. Cl. .......................... 331/117 FE; 331/117 R; 331/36 C; 331/167
(58) Field of Search ....................... 331/117 FE, 117 R, 331/167, 36 C, 177 V

(56) References Cited

U.S. PATENT DOCUMENTS 5,469,118 A  11/1995  Lawton ........................ 331/113
5,621,362 A  4/1997  McKinney et al. ........ 331/117 R
6,016,082 A  * 1/2000  Cruz et al. ............. 331/117 FE

* cited by examiner

Primary Examiner—Arnold Kinkead
(74) Attorney, Agent, or Firm—Fulbright & Jaworski, LLP

(57) ABSTRACT

A cross-coupled cascode voltage controlled oscillator including a variable-frequency tank circuit, first and second cascode-coupled active devices coupled to the tank circuit, and third and fourth cascode-coupled active devices coupled to the tank circuit, the first and second active devices being cross-coupled to the third and fourth active devices. The invention produces lower drain the gate voltages resulting in fewer device failures.

16 Claims, 4 Drawing Sheets

US 6,700,451 B1

CROSS COUPLED CASCODE VOLTAGE CONTROLLED OSCILLATOR

BACKGROUND OF THE INVENTION

1. Field of the Invention

The invention relates generally to the field of voltage controlled oscillators. More particularly, the invention relates to a cross-coupled cascode voltage controlled oscillator.

2. Discussion of the Related Art

A voltage controlled oscillator (VCO) is a circuit that generates an oscillating signal at a frequency proportional to an externally applied control voltage. These types of circuits find several applications in telecommunications, and are useful for tracking and matching signal frequencies as they shift due to thermal variations, power supply fluctuations, and other sources of frequency shifts.

Typically, a VCO comprises a resonant circuit coupled to an amplifier circuit. The amplifier design can be critical since modern electronics often requires a VCO to operate with a large signal swing or amplitude. A problem with current technology is that large signal operation often causes voltage breakdown processes.

In the prior art, drain to gate voltage breakdown problems that occur in the amplifier circuit of a VCO have been solved by reducing the supply voltage and/or using higher breakdown parts. Nevertheless, these measures tend to reduce signal swing and result in degradation of signal-to-noise floor performance, making it difficult to meet the far-out noise requirements of several applications. Further, higher breakdown parts may not be available, or may not meet other design specifications.

Until now, the requirements of providing a method and/or apparatus for a voltage controlled oscillator which allows a high signal swing while minimizing breakdown problems have not been met.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

Figure 1:
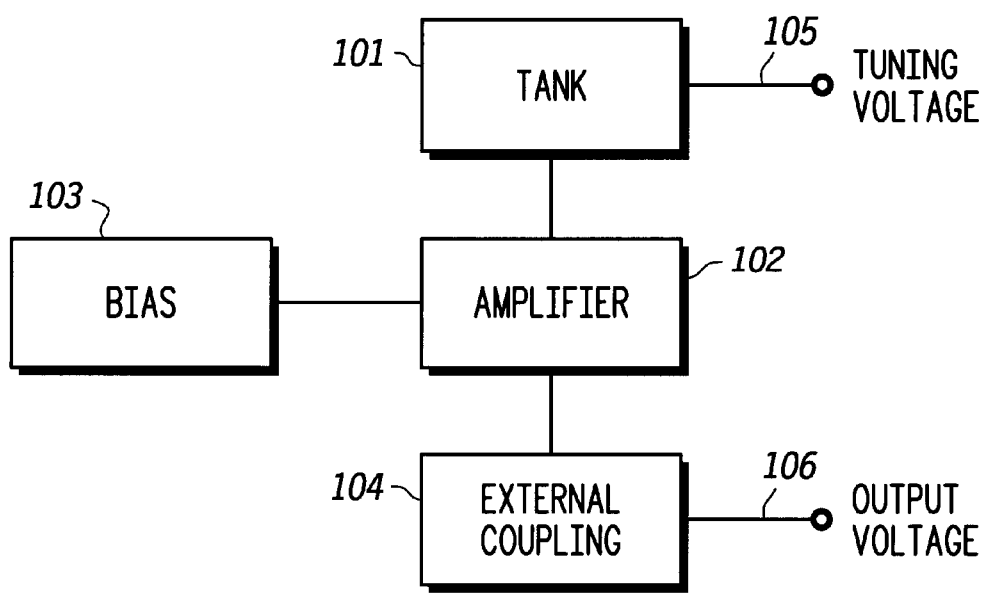
FIG. 1 is a block diagram of a voltage controlled oscillator.

Referring to FIG. 1, a block diagram of a voltage controlled oscillator 100 is depicted. A variable-frequency tank circuit 101 is coupled to an amplifier circuit 102. The amplifier circuit 102 is coupled to a bias (or enable) circuit 103 and to an external coupling circuit 104. A tuning voltage 105 may tune the tank circuit 101 and determine the frequency of an output voltage 106. The bias circuit 103 enables operation of the voltage controlled oscillator 100.

Figure 2:
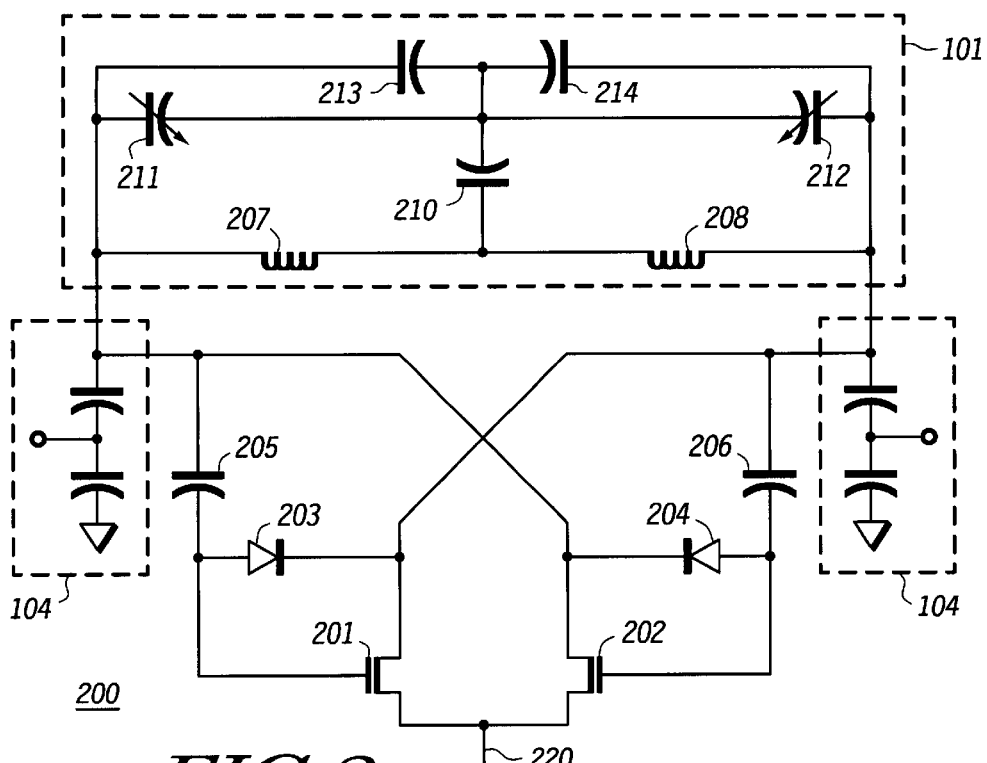
FIG. 2 is a circuit diagram of an amplifier and tank circuit in a prior art voltage controlled oscillator.

Referring to FIG. 2, a circuit diagram of an amplifier and tank circuit 200 of a prior-art voltage controlled oscillator are depicted. The variable-frequency tank circuit 101 and the external coupling circuit 104 detailed in FIG. 1 are shown in more detail. A pair of field effect transistors (FETs) 201, 202 is cross-coupled through capacitors 205, 206. Diodes 203, 204 clamp the gate voltages to the drain voltages of transistors 201 and 202, respectively. A tuning voltage may be applied to a node between a pair of voltage variable capacitors 211, 212 to change the frequency of oscillation of the VCO 200. A pair of fixed value capacitors 213, 214 is coupled to the pair of voltage variable capacitors 211, 212. A voltage supply is applied to a node between a pair of inductors 207, 208. The pair of inductors 207, 208 is coupled to the pair of voltage variable capacitors 211, 212 through a fixed value capacitor 210.

Figure 3:
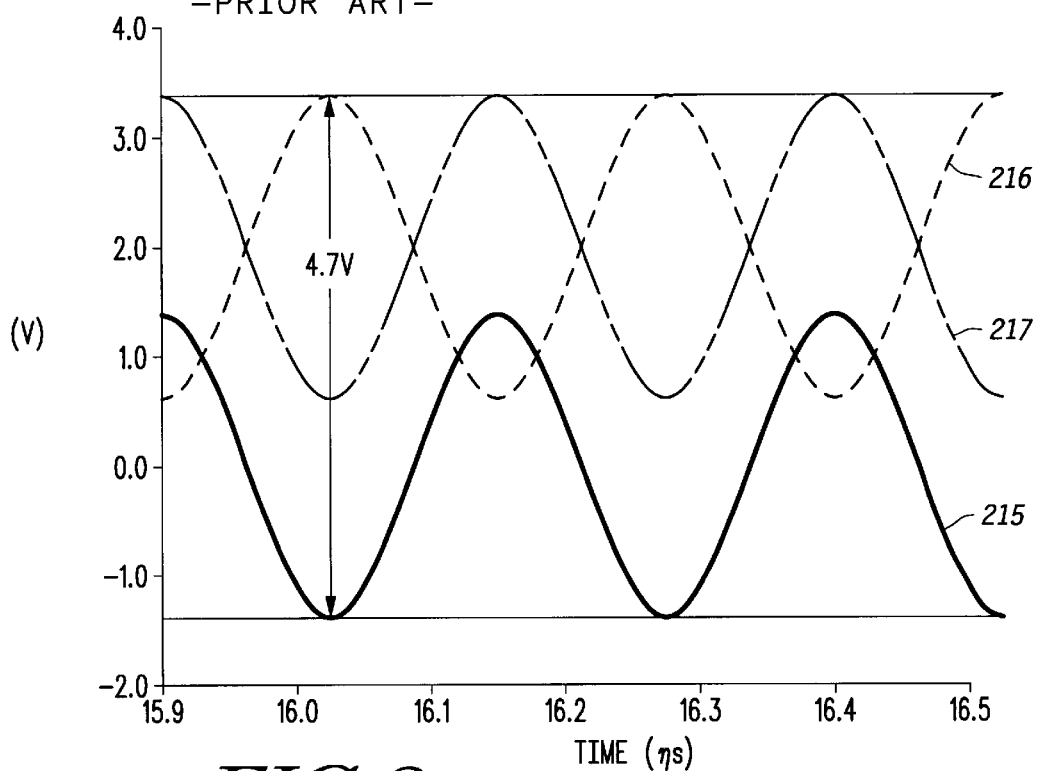
FIG. 3 is a graph of simulated signals characteristic of the prior art voltage controlled oscillator of FIG. 2.

Referring to FIG. 3, a simulated graph of signals characteristic of the prior-art non-cascode voltage controlled oscillator 200 detailed in FIG. 2 is depicted. The vertical axis is the voltage (in Volts) and the horizontal axis is time (in nanoseconds). In this simulation, transistor 201 was probed at its gate and drain, yielding a gate voltage curve 215 and a drain voltage curve 216, relative to node 220. Transistor 202 was probed at its drain (opposite drain), yielding an opposite drain voltage curve 217 (180° out of phase with gate voltage 215), relative to node 220. In this simulation, the output frequency of the VCO was 4.07 GHz with a sideband noise (SBN) of −156 dBc/Hz at a 20 MHz offset. The output current was 19.6 mA and the maximum drain-to-gate voltage difference is seen to be 4.7 Volts.

The software used in all simulations for which results are presented herein was Spectre, from Cadence Design Systems, Inc.

When compared to a directly coupled circuit (with capacitors 205, 206 shorted), the circuit 200 detailed in FIG. 2 usually provides the noise improvement necessary for applications such as, for example, global systems for mobile communications (GSM). Nevertheless, the resulting gateto-drain voltage of 4.7 Volts can cause low breakdown processes which may result in failure of the device. The present invention includes a cross-coupled cascode voltage controlled oscillator which allows a high signal swing while minimizing breakdown problems and electrical noise.

Figure 4:
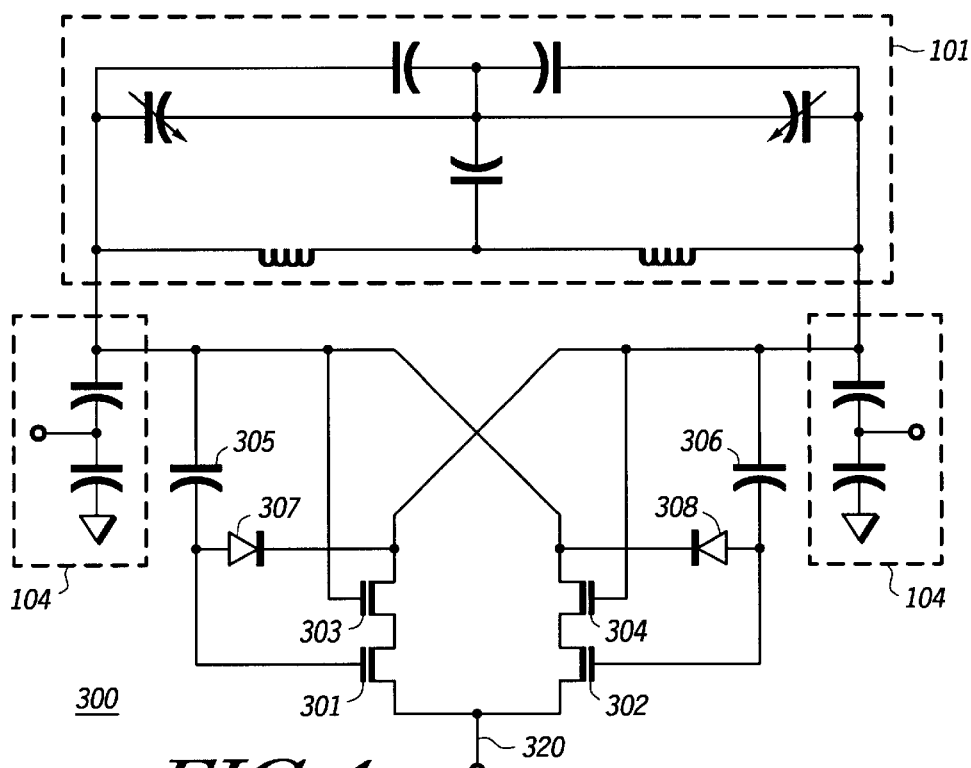
FIG. 4 is a circuit diagram of a cross-coupled cascode voltage controlled oscillator, representing an embodiment of the invention.

Referring to FIG. 4, a circuit diagram of a cross-coupled cascode voltage controlled oscillator 300 is depicted according to an exemplary embodiment of the invention. A set of first and second active devices 301, 303 is coupled in a cascode configuration. Another set of third and fourth active devices 302, 304 is also coupled in a cascode configuration and cross-coupled with the first and second active devices 301, 303.

Still referring to FIG. 4, the source of active device 303 is coupled to the drain of active device 301. The source of active device 304 is coupled to the drain of active device 302. Active device 303 has its drain coupled to the gate of active device 301 through a clamping diode 307. Active device 304 has its drain coupled to the gate of active device 302 through another clamping diode 308. The gate of active device 301 is coupled to the gate of active device 303 through a capacitor 305. The gate of active device 302 is coupled to the gate of active device 304 through another capacitor 306. The sources of active devices 301 and 302 are directly coupled at a common source terminal 320. The gate of active device 303 is coupled to the drain of active device 304. The gate of active device 304 is coupled to the drain of active device 303.

Figure 5:
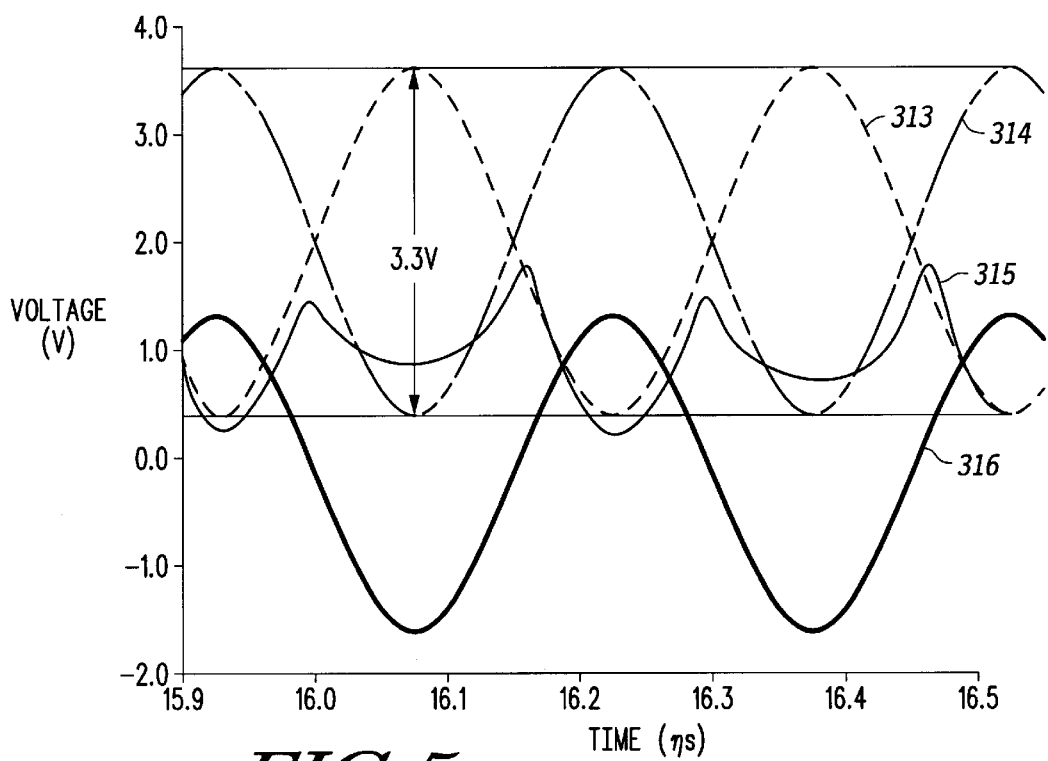
FIG. 5 is a graph of simulated signals characteristic of the cross-coupled cascode voltage controlled oscillator of FIG. 4, illustrating an embodiment of the invention.

Referring to FIG. 5, a simulated graph of signals characteristic of the cross-coupled cascode voltage controlled oscillator 300 detailed in FIG. 4 is depicted illustrating one aspect of the invention. The vertical axis is the voltage (in Volts) and the horizontal axis is time (in nanoseconds). In this simulation, active device 303 was probed at its drain, gate, and source, yielding a drain voltage curve 313, a gate voltage curve 314, and a source voltage curve 315, all relative to node 320. Active device 301 was probed at the gate yielding gate voltage curve 316 relative to node 320. In this simulation, the output frequency of the VCO 300 was 3.43 GHz with a sideband noise of −158 dBc/Hz at a 20 MHz offset. The output current was 25 mA and the maximum drain-to-gate voltage difference (between 313 and 314 or between 315 and 316) is seen to be 3.3 Volts.

Referring to FIGS. 4 and 5, a cross-coupled cascode voltage controlled oscillator 300 may achieve a reduction in maximum gate to drain voltage of approximately 1.4 Volts compared to prior-art circuit 200 of FIG. 2 while maintaining substantially the same signal-to-noise performance at approximately the same carrier frequency. In one embodiment, active elements 301–304 may be field-effect transistors (FETs).

Figure 6:
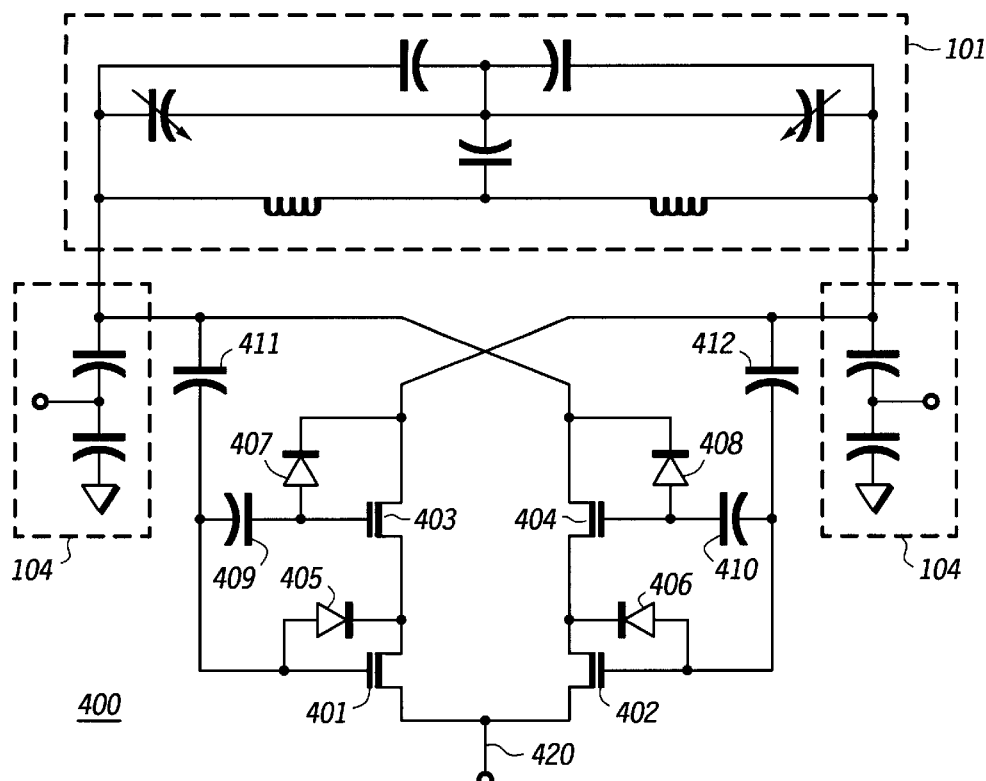
FIG. 6 is a circuit diagram of another cross-coupled cascode voltage controlled oscillator, representing an embodiment of the invention.

Referring to FIG. 6, a circuit diagram of another cross-coupled cascode voltage controlled oscillator 400 is depicted according to another exemplary embodiment of the invention. A set of first and second active devices 401, 403 is coupled in a cascode configuration. Another set of third and fourth active devices 402, 404 is also coupled in a cascode configuration and cross-coupled with the first and second active devices 401, 403.

Still referring to FIG. 6, a set of four diodes 405–408 act as voltage clamps between the drains and gates of each of the four active devices 401–404. The source of active device 403 is coupled to the drain of active device 401. The source of active device 404 is coupled to the drain of active device 402. The gate of active device 403 is coupled to the gate of active device 401 through a first capacitor 409. The gate of active device 404 is coupled to the gate of active device 402 through a second capacitor 410. The drain of active device 404 is coupled to the gate of active device 401 through a third capacitor 411. The drain of active device 403 is coupled to the gate of active device 402 through a fourth capacitor 412. The sources of active devices 401 and 402 are directly coupled at a common source terminal 420.

Figure 7:
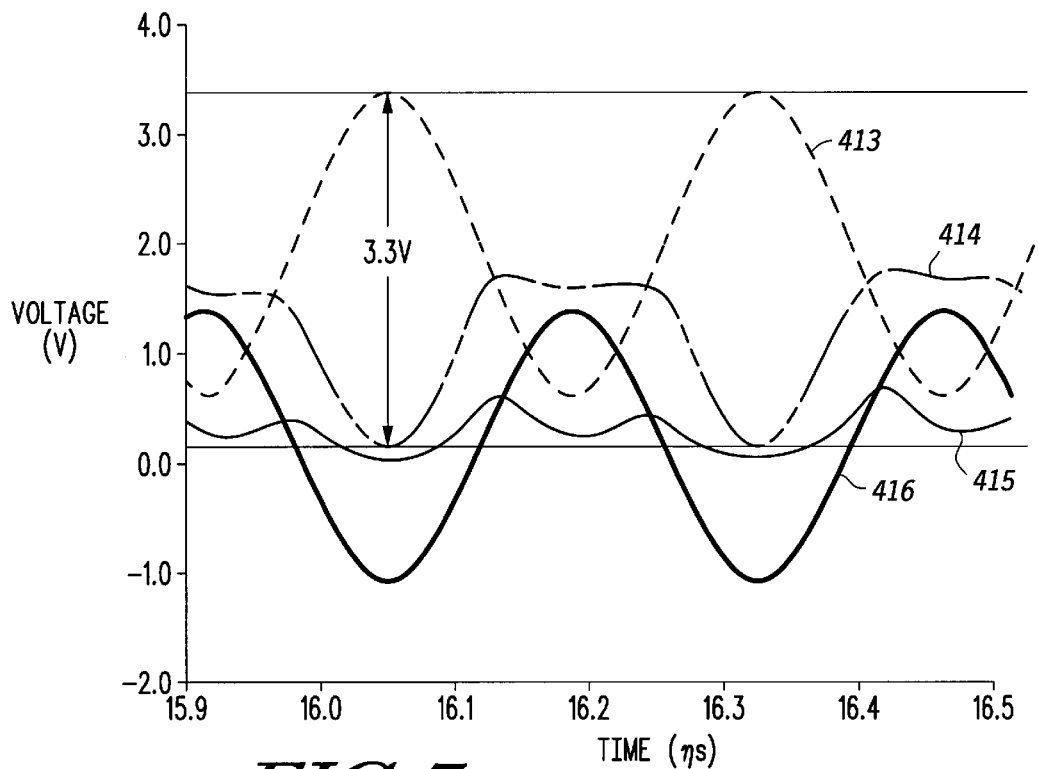
FIG. 7 is a graph of simulated signals characteristic of the cross-coupled cascode voltage controlled oscillator of FIG. 6, illustrating an embodiment of the invention.

Referring to FIG. 7, a simulated graph of signals characteristic of the cross-coupled cascode voltage controlled oscillator 400 detailed in FIG. 6 is depicted illustrating one aspect of the invention. The vertical axis is the voltage (in Volts) and the horizontal axis is time (in nanoseconds.) In this simulation, active element 403 was probed at its drain, gate, and source, yielding drain voltage curve 413, a gate voltage curve 414, and source voltage curve 415, relative to node 420. Active element 401 was probed at its gate, yielding gate voltage curve 416 relative to node 420. In this simulation, the output frequency of the VCO was 3.76 GHz with a sideband noise of −157 dBc/Hz at a 20 MHz offset. The output current was 21.7 mA and the maximum drain-to-gate voltage difference (between 413 and 414) is seen to be 3.3 Volts.

Referring to FIGS. 6 and 7, a cross-coupled cascode voltage controlled oscillator 400 may achieve a maximum gate to drain voltage reduction of at least 1.4 Volts compared to prior-art circuit 200 of FIG. 2 and provide a current reduction of at least 3.3 mA compared to the circuit 300 of FIG. 4, while maintaining substantially the same signal-to-noise performance at approximately the same carrier frequency. In one embodiment, active elements 401–404 may be field-effect transistors (FETs).

The terms a or an, as used herein, are defined as one or more than one. The term plurality, as used herein, is defined as two or more than two. The terms including and/or having, as used herein, are defined as comprising (i.e., open language). The term coupled, as used herein, is defined as connected, although not necessarily directly, and not necessarily mechanically.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A cross-coupled cascode voltage controlled oscillator, comprising:

a variable-frequency tank circuit;

first and second field-effect transistors disposed in cascode configuration and connected to the tank circuit and driven substantially in-phase with each other, a source of the second field-effect transistor being coupled to a drain of the first field-effect transistor and a gate of the first field-effect transistor being coupled to a gate of the second field-effect transistor through a first capacitor; and third and fourth field-effect transistors disposed in cascode configuration and connected to the tank circuit and driven substantially in-phase with each other and out of phase relative to the first and second field effect transistors, a source of the fourth field-effect transistor being coupled to a drain of the third field-effect transistor, a gate of the third field-effect transistor being coupled to a gate of the fourth field-effect transistor through a second capacitor, the first and second field-effect transistors being cross-coupled to the third and fourth field-effect transistors.

2. A cross-coupled cascode voltage controlled oscillator, comprising: a variable-frequency tank circuit;

first and second field-effect transistors disposed in cascode configuration and connected to the tank circuit and driven substantially in-phase with each other; and third and fourth field-effect transistors disposed in cascode configuration and connected to the tank circuit and driven substantially in-phase with each other and out of phase relative to the first and second field effect transistors, the first and second field-effect transistors being cross-coupled to the third and fourth field-effect transistors, the first and fourth field-effect transistors being cross-coupled through a capacitor.

3. A cross-coupled cascode voltage controlled oscillator, comprising: a variable-frequency tank circuit;

first and second field-effect transistors disposed in cascode configuration and connected to the tank circuit and driven substantially in-phase with each other; and third and fourth field-effect transistors disposed in cascode configuration and connected to the tank circuit and driven substantially in-phase with each other and out of phase relative to the first and second field effect transistors, the first and second field-effect transistors being cross-coupled to the third and fourth field-effect transistors, the second and third field-effect transistors being cross-coupled through a capacitor.

4. A cross-coupled cascode voltage controlled oscillator, comprising: a variable-frequency tank circuit;

first and second field-effect transistors disposed in cascode configuration and connected to the tank circuit and driven substantially in-phase with each other; and third and fourth field-effect transistors disposed in cascode configuration and connected to the tank circuit and driven substantially in-phase with each other and out of phase relative to the first and second field effect transistors, the first and second field-effect transistors being cross-coupled to the third and fourth field-effect transistors, the second and fourth field-effect transistors being directly cross-coupled.

5. A cross-coupled cascode voltage controlled oscillator, comprising:

a variable-frequency tank circuit;

first and second active devices coupled to the tank circuit and driven substantially in-phase with each other, a source of the second active device being coupled to a drain of the first active device and a gate of the first active device being coupled to a gate of the second active device through a first capacitor; and third and fourth active devices coupled to the tank circuit and driven substantially in-phase with each other and out of phase relative to the first and second active devices, a source of the fourth active device being coupled to a drain of the third active it device, a gate of the third active device being coupled to a gate of the fourth active device through a second capacitor, a drain of the second active device being coupled to the gate of the fourth active device and a drain of the fourth active device being coupled to the gate of the second active device.

6. The cross-coupled cascode voltage controlled oscillator of claim 5, further comprising a clamping diode coupling the gate of the first active device to the drain of the second active device.

7. The cross-coupled cascode voltage controlled oscillator of claim 5, further comprising a clamping diode coupling the gate of the third active device to the drain of the fourth active device.

8. The cross-coupled cascode voltage controlled oscillator of claim 5, further comprising an external coupling circuit coupled to the tank circuit.

9. The cross-coupled cascode voltage controlled oscillator of claim 5, the first, second, third, and fourth active devices comprising field-effect transistors.

10. A cross-coupled cascode voltage controlled oscillator, comprising:

a variable-frequency tank circuit;

first and second active devices coupled to the tank circuit and driven substantially in-phase with each other, a source of the second active device being coupled to a drain of the first active device and a gate of the first active device being coupled to a gate of the second active device through a first capacitor; and third and fourth active devices coupled to the tank circuit and driven substantially in-phase with each other and out of phase relative to the first and second active devices, a source of the fourth active device being coupled to a drain of the third active device, a gate of the third active device being coupled to a gate of the fourth active device through a second capacitor, a drain of the second active device being coupled to the gate of the third active device through a third capacitor and a drain of the fourth active device being coupled to the gate of the first active device through a fourth capacitor.

11. The cross-coupled cascode voltage controlled oscillator of claim 10, further comprising a clamping diode coupling the gate of the first active device to the drain of the first active device.

12. The cross-coupled cascode voltage controlled oscillator of claim 10, further comprising a clamping diode coupling the gate of the second active device to the drain of the second active device.

13. The cross-coupled cascode voltage controlled oscillator of claim 10, further comprising a clamping diode coupling the gate of the third active device to the drain of the third active device.

14. The cross-coupled cascode voltage controlled oscillator of claim 10, further comprising a clamping diode coupling the gate of the fourth active device to the drain of the fourth active device.

15. The cross-coupled cascode voltage controlled oscillator of claim 10, further comprising an external coupling circuit coupled to the tank circuit.

16. The cross-coupled cascode voltage controlled oscillator of claim 11, the first, second, third, and fourth active devices comprising field-effect transistors.

* * * * *